United States Patent
Lu et al.

(10) Patent No.: US 7,362,573 B2
(45) Date of Patent: Apr. 22, 2008

(54) HEAT DISSIPATION DEVICE

(75) Inventors: Cui-Jun Lu, Shenzhen (CN);
Song-Shui Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 47 days.

(21) Appl. No.: 11/308,763

(22) Filed: Apr. 28, 2006

(65) Prior Publication Data

US 2007/0253160 A1 Nov. 1, 2007

(51) Int. Cl.
*H05K 7/20* (2006.01)

(52) U.S. Cl. ............... 361/695; 361/690; 361/704; 361/709; 361/710; 165/80.2; 165/80.3; 165/185; 257/707; 257/727

(58) Field of Classification Search ......... 361/690, 361/700, 702, 704–712, 714–724; 165/80.3, 165/80.6, 185, 104.21–104.26, 104.33; 257/706–727; 176/16.3; 29/512, 830, 832, 890.03
See application file for complete search history.

(56) References Cited

U.S. PATENT DOCUMENTS

| | | | |
|---|---|---|---|
| 6,330,908 B1 * | 12/2001 | Lee et al. ............... 165/185 |
| 6,386,274 B1 * | 5/2002 | Wang et al. ............ 165/80.3 |
| 6,452,803 B1 * | 9/2002 | Liu ....................... 361/704 |
| 6,714,415 B1 | 3/2004 | Shah |
| 6,828,673 B2 * | 12/2004 | Ficorilli et al. ......... 257/707 |
| 6,851,467 B1 * | 2/2005 | Bamford et al. ......... 165/80.3 |
| 7,055,577 B2 * | 6/2006 | Wang et al. ............ 165/80.3 |
| 7,123,483 B2 * | 10/2006 | Otsuki et al. ........... 361/710 |
| 7,177,932 B2 * | 10/2006 | Ku et al. ................. 165/121 |
| 7,142,426 B2 * | 11/2006 | Wang et al. ............ 361/704 |
| 7,200,934 B2 * | 4/2007 | Carter et al. ........... 29/890.03 |
| 7,221,567 B2 * | 5/2007 | Otsuki et al. ........... 361/695 |
| 2006/0126303 A1 * | 6/2006 | Wang et al. ............ 361/704 |
| 2006/0219386 A1 * | 10/2006 | Hsia et al. ............... 165/80.3 |

* cited by examiner

*Primary Examiner*—Michael Datskovskiy
(74) *Attorney, Agent, or Firm*—Jeffrey T. Knapp

(57) ABSTRACT

A heat dissipation device includes a heat sink having a heat conducting core and a plurality of fins extending from the core. The core has a downward extension portion extending away the fins for contacting a heat generating device. A locking device includes a locking plate defining a central opening accommodating the extension portion of the core of the heat sink therein and has a plurality of locking arms extending from the locking plate. Pluralities of cutouts circumferentially surrounding and communicating with the opening are defined in the locking plate. The extension portion of the core of the heat sink is punched to press the locking plate of the locking device toward the heat sink and have portions thereof engaged in the cutouts of the locking plate of the locking device, whereby the locking device is stably fixed to the heat sink.

18 Claims, 7 Drawing Sheets

HEAT DISSIPATION DEVICE

FIELD OF THE INVENTION

The present invention relates generally to a heat dissipation device, and more particularly to a heat dissipation device incorporating a locking device for securing the heat dissipation device to a heat-generating electronic device.

DESCRIPTION OF RELATED ART

With advancement of computer technology, electronic devices are achieving ever higher operating speeds. It is well known that the faster electronic devices operate, the more heat they generate. If the heat is not quickly dissipated, the operation of the electronic devices will suffer. Generally, in order to ensure normal running of the electronic device, a heat dissipation device is used to dissipate the heat generated by the electronic device. In order to keep the heat dissipation device in intimate contact with the electronic device, a locking device is usually used to secure the heat dissipation device to the electronic device.

A conventional heat dissipation device comprises a heat sink having a channel defined in an upper face of a base thereof, and an elongated locking device accommodated in the channel. The locking device engages with a retention module surrounding an electronic device, to thereby attach the heat sink to the electronic device. Unfortunately, the channel occupies space in the base which would otherwise be occupied by heat dissipating fins of the heat sink. The channel thus reduces the heat dissipating surface area of the heat sink.

Another kind of conventional heat dissipation device comprises a heat sink and a locking device attached to heat sink via a plurality of screws engaged with a base of the heat sink. The locking device then secures the heat sink to an electronic device. However, the heat sink and the locking device need to define threaded holes aligning to each other for accommodating a corresponding screw, which requires unduly precise manufacturing engineering, thereby producing high cost to the heat dissipation device. Furthermore, in use, the screws are prone to become loose from the heat sink and the locking device, which results in the heat sink not intimately contacting the electronic device.

What is needed, therefore, is a heat dissipation device having low cost and a stable structure.

SUMMARY OF INVENTION

A heat dissipation device in accordance with a preferred embodiment of the present invention comprises a heat sink having a heat conducting core and a plurality of fins radially extending from the core. The core has an extension portion extending downwardly from the core and configured for contacting a heat generating device. A locking device comprises a locking plate defining a central opening accommodating the extension portion of the core of the heat sink therein and has a plurality of locking arms extending from the plate. Pluralities of cutouts circumferentially surrounding and communicating with the opening are defined in the locking plate. The locking plate has an engaging portion engaging with the heat sink. A protrusion extends from the engaging portion and is engaged in a space defined between two adjacent fins of the heat sink. The extension portion of the core of the heat sink is punched to press the locking plate of the locking device toward the heat sink and have portions thereof engaged in the cutouts of the locking plate of the locking device, whereby the locking device is stably fixed to the heat sink. A plurality of fixing arms extends outwardly from the locking plate. A plurality of fasteners engages with the fixing arms for fastening the heat sink to the heat generating device.

Other advantages and novel features will become more apparent from the following detailed description of preferred embodiments when taken in conjunction with the accompanying drawings, in which:

BRIEF DESCRIPTION OF DRAWINGS any aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION

Figure 1:
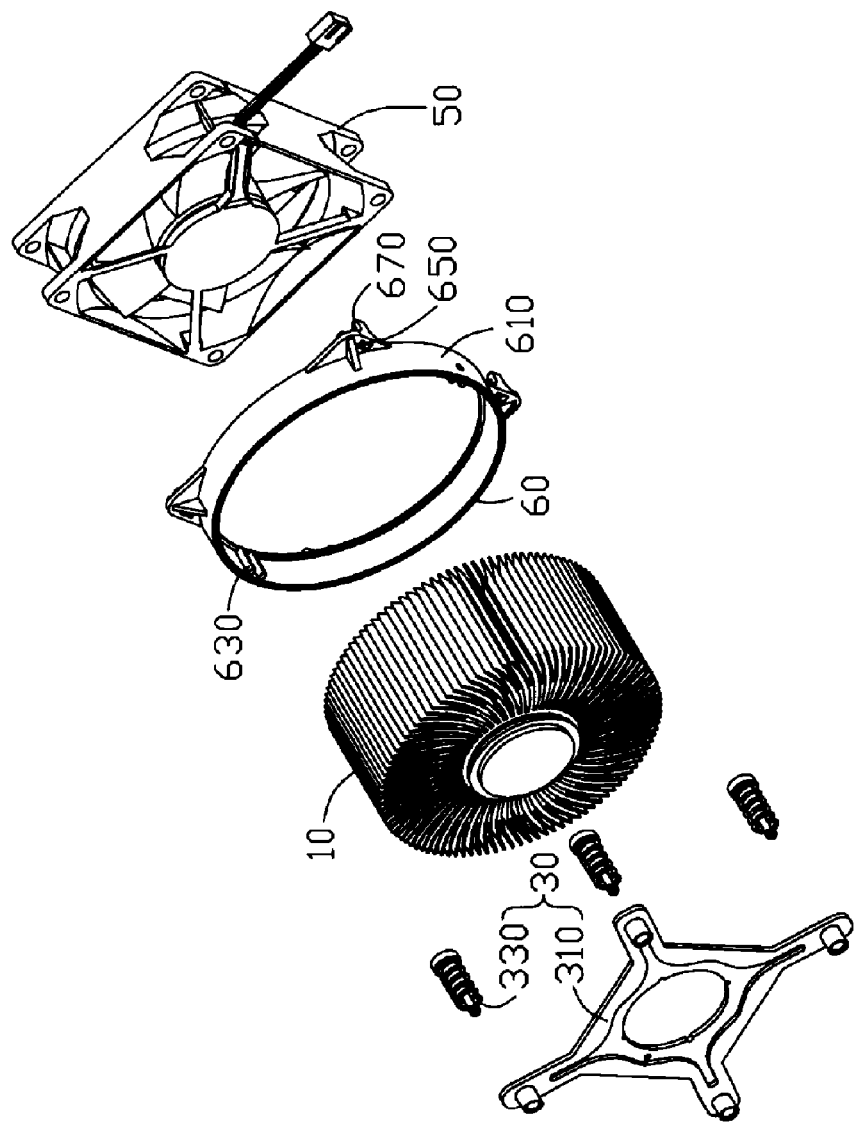
FIG. 1 is an exploded, isometric view of a heat dissipation device in accordance with a preferred embodiment of the present invention.

Referring to FIG. 1, a heat dissipation device in accordance with a preferred embodiment of the present invention is shown. The heat dissipation device comprises a heat sink 10, a locking device 30 engaged with the heat sink 10 for securing the heat sink 10 to an electronic device (not shown) located on a printed circuit board (not shown), and a fan 50 located on the heat sink 10 to provide forced airflow to the heat sink 10.

Figure 2:
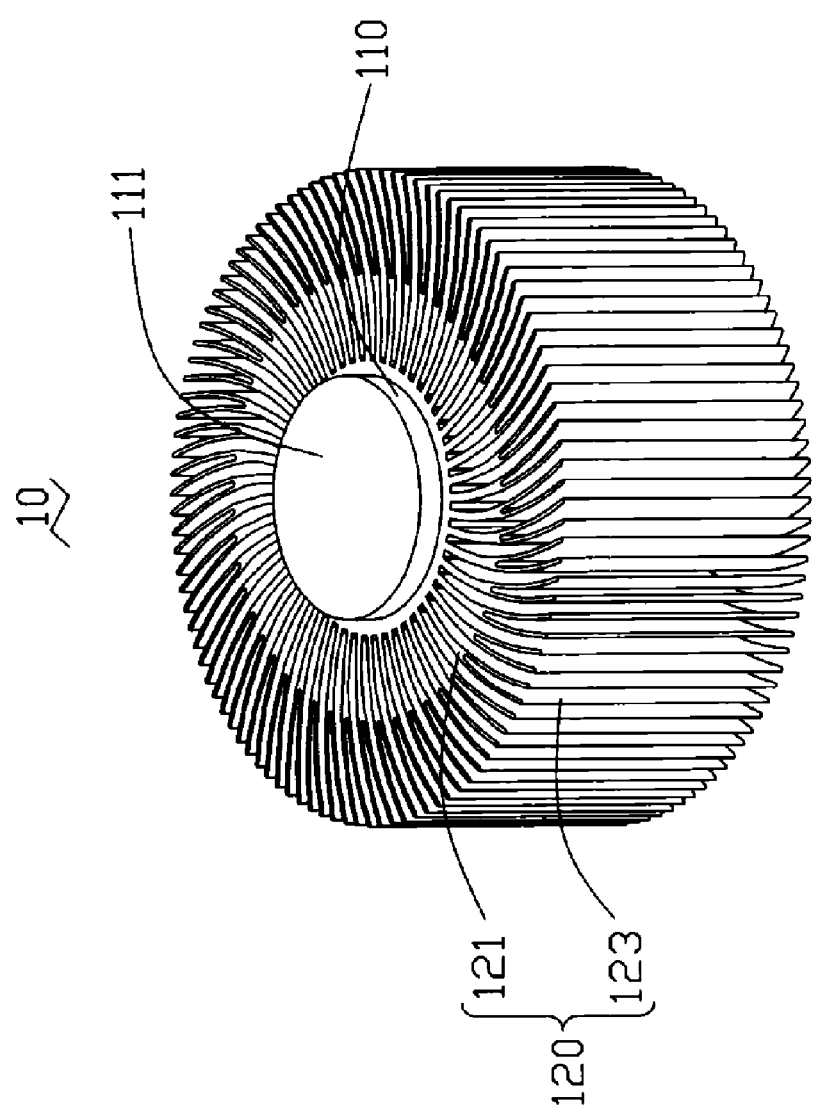
FIG. 2 shows a heat sink of FIG. 1 before stamping/pressing.

Referring also to FIG. 2, the heat sink 10 is integrally extruded from heat conducting metal, for example, aluminum, and comprises a substantially cylindrical solid core 110 and a plurality of fins 120 radially and curvingly extending from an periphery of the core 110. A cylindrical extension portion 111 integrally extends downwardly from a bottom end of the core 110 in an axial direction of the core 110. The extension portion 111 is used for contacting with the electronic device. It can be understood, the core 110 can be hollowed in an upper portion thereof to contain thermally conducting media therein. Each fin 120 has a trunk 121 extending from the core 110 and two branches 123 splitting from the trunk 121.

Figure 3:
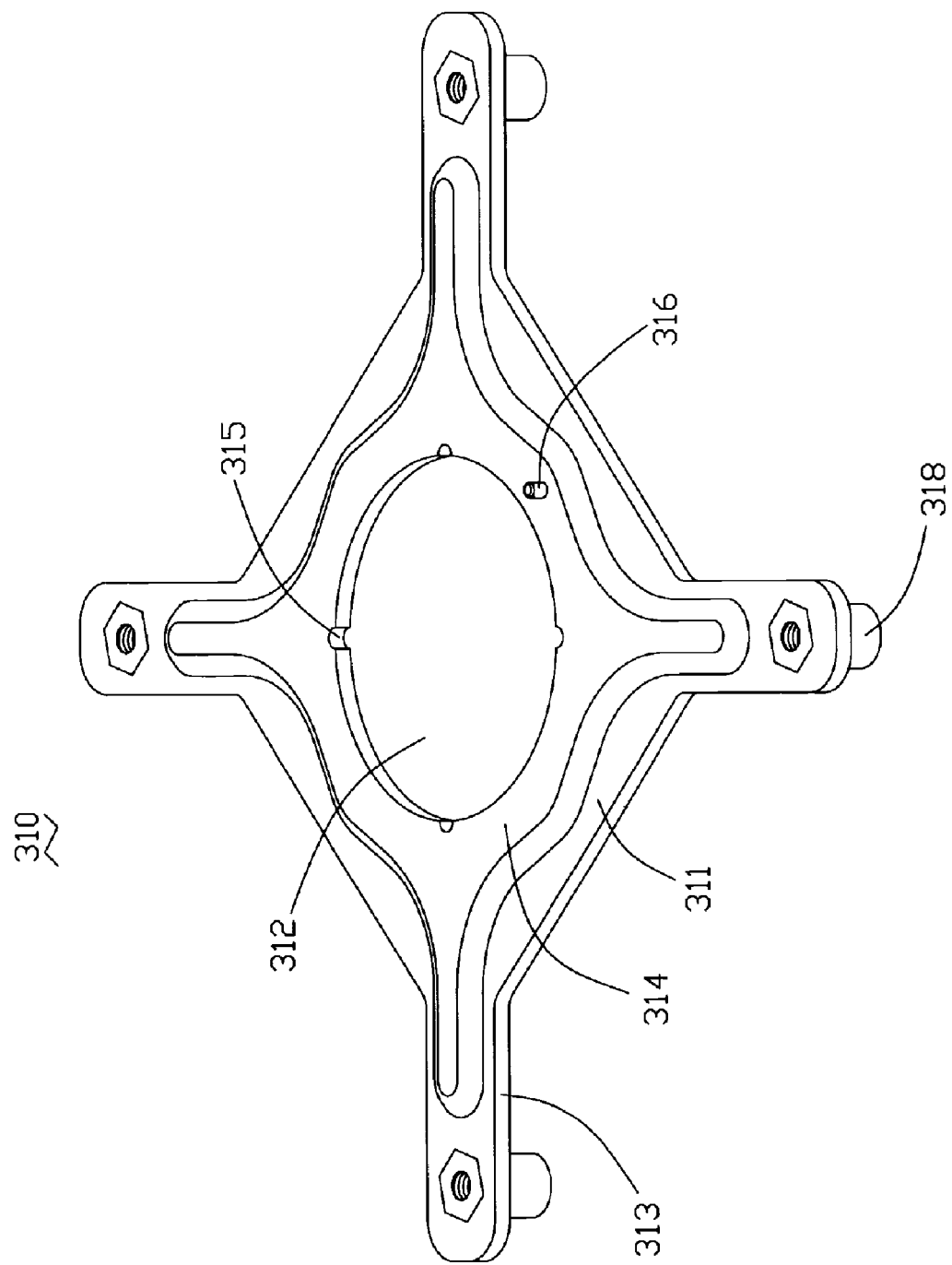
FIG. 3 shows a locking device of FIG. 1.
Figure 4:
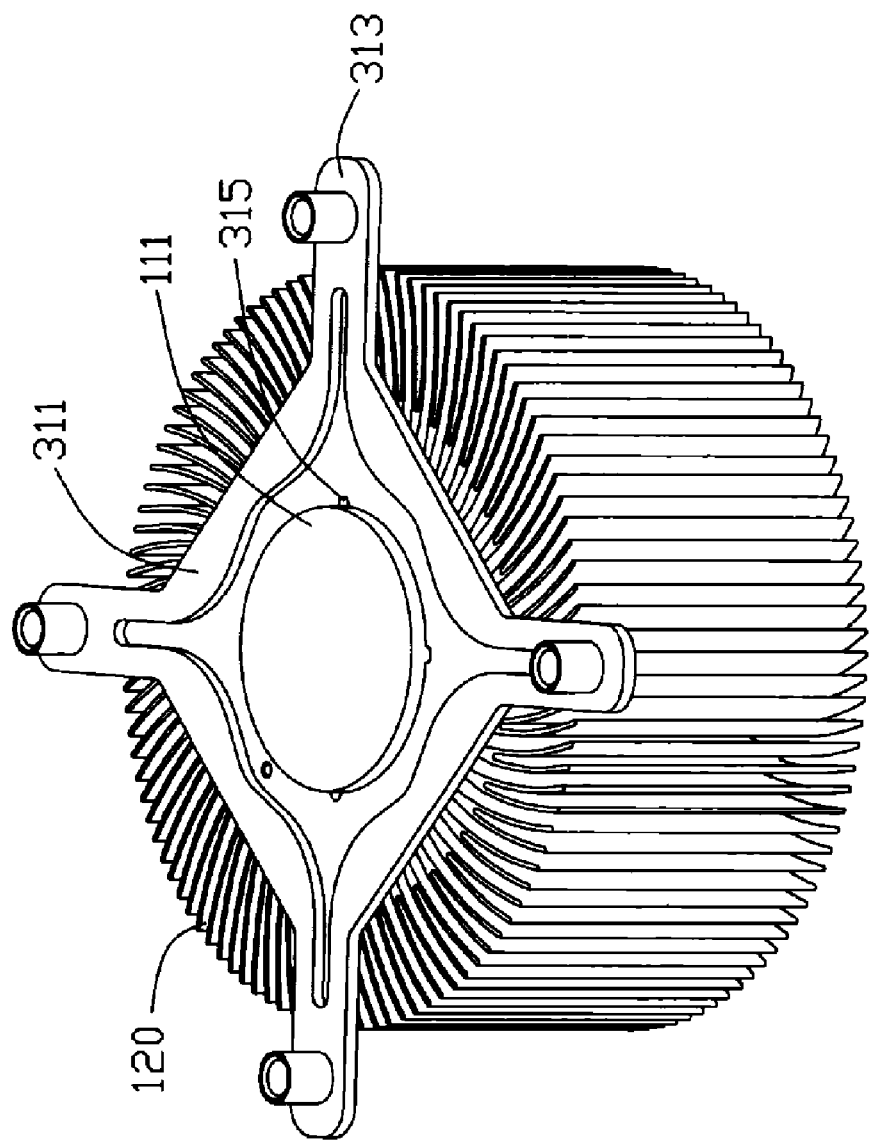
FIG. 4 is an assembled view of the heat sink of FIG. 2 and the locking device of FIG. 3.
Figure 5:
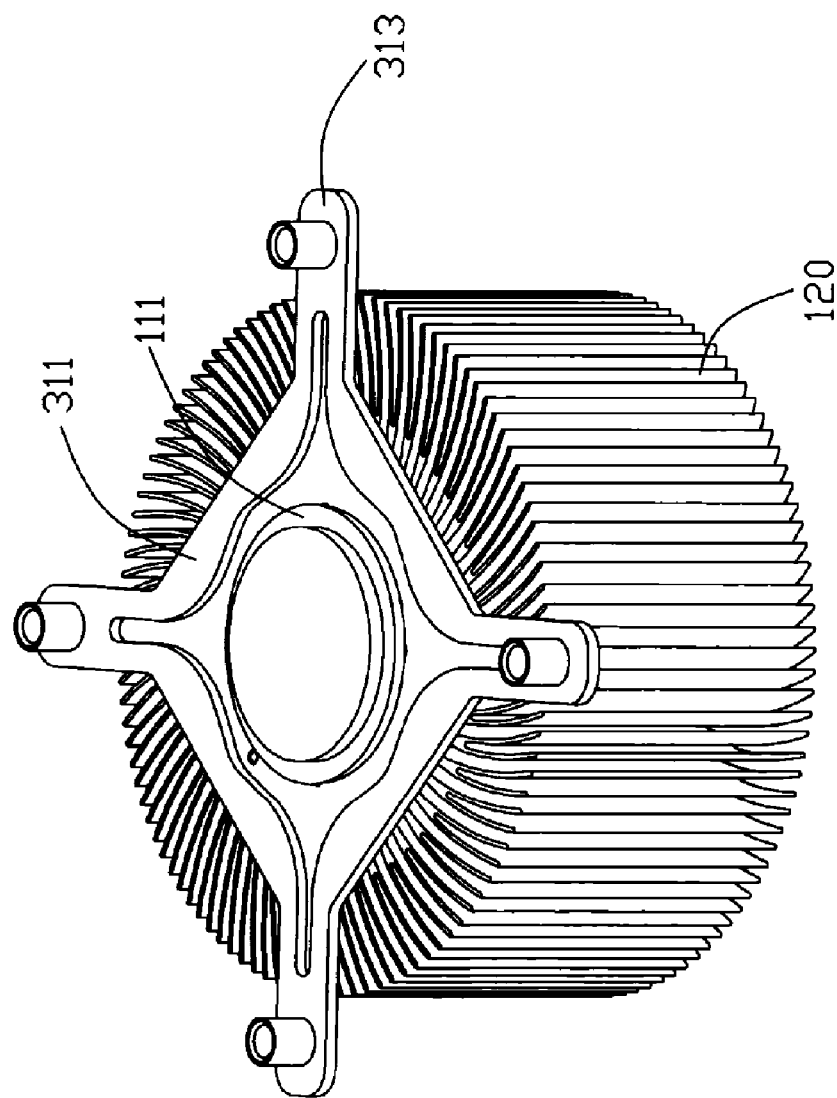
FIG. 5 is an assembled view similar to FIG. 4 with the heat sink after being stamped/pressed.
Figure 6:
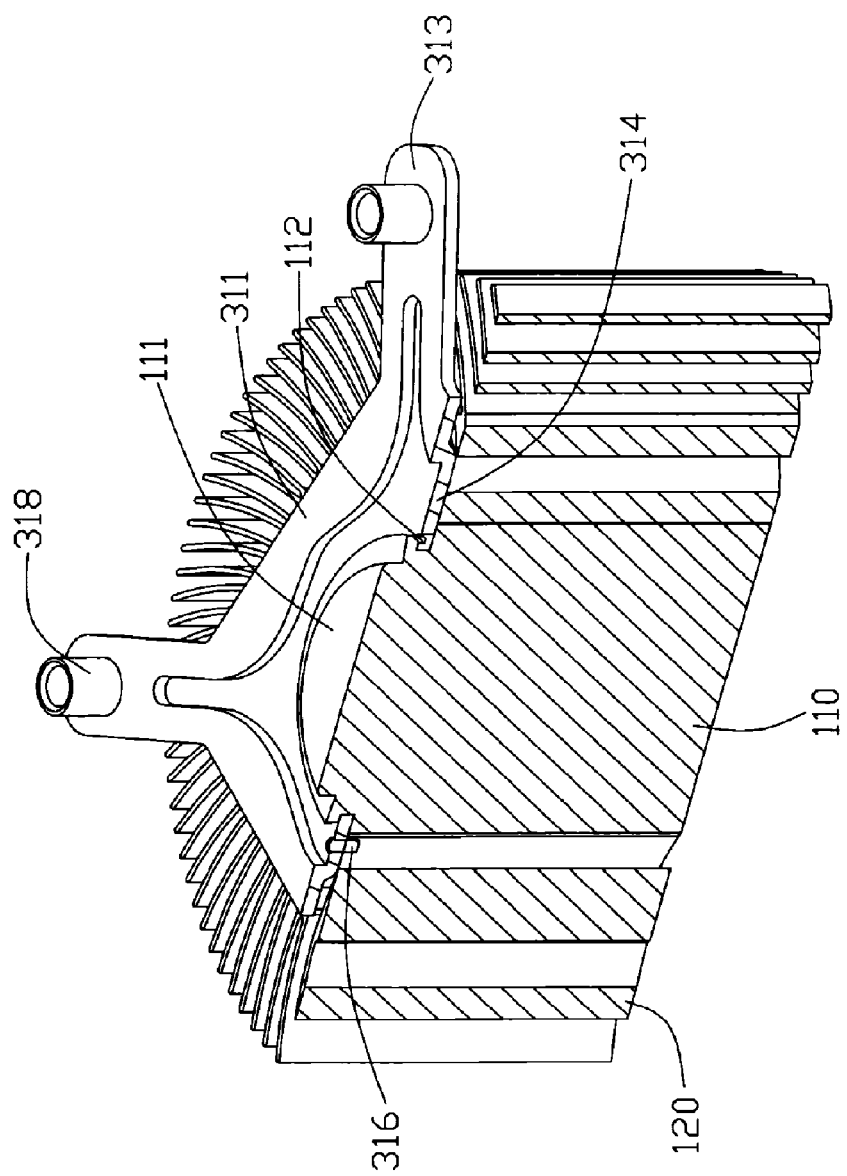
FIG. 6 is a cutaway view of FIG. 5.
Figure 7:
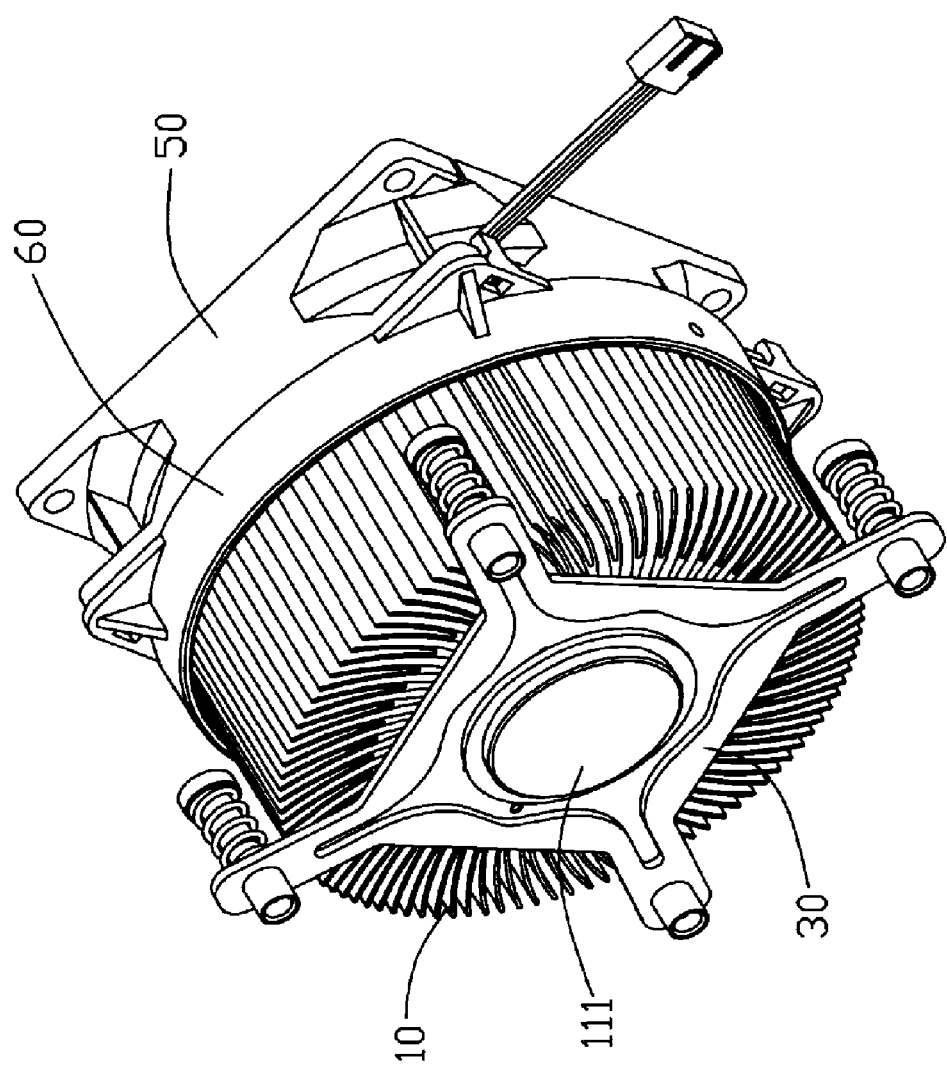
FIG. 7 is an assembled view of FIG. 1.

Referring also to FIG. 3, the locking device 30 comprises a clip 310 and a plurality of fasteners 330 for fastening the clip 310 to the printed circuit board. The clip 310 is one-piece member and comprises a substantially rectangular plate 311 and four arms 313 extending outwardly from four corners of the plate 311 respectively. The plate 311 defines a circular opening 312 therethrough in a center thereof, for accommodating the extension portion 111 of the heat sink 10. The plate 311 has an engaging portion 314 embossed upwardly around the opening 311. The engaging portion 314 further extends to the arms 313. Corresponding the four arms 313, the opening 312 extends outwardly to define four cutouts 315 circumferentially surrounding and communicating with the opening 312. A positioning protrusion 316 extends upwardly from the engaging portion 314. Each arm 313 has a fixing hole (not labeled) defined in a distal end thereof for accommodating a corresponding fastener 330 therein. Under the fixing hole, a locking sleeve 318 extends downwardly from each arm 310. The fasteners 330 each comprise a bolt (not labeled) and a spring (not labeled) combined with the bolt.

Referring to FIGS. 4-7, in assembly, the extension portion 111 is accommodated in the opening 312 of the clip 310 of locking device 30. The engaging portion 314 of the clip 310 engages with the heat sink 10. The protrusion 316 of the clip 310 is inserted into a gap between two adjacent trunks 121 of corresponding fins 120 (see FIG. 6). The extension portion 111 is punched toward the clip 310, to thereby expand in a radial direction thereof, whereby the extension portion 111 is jammed in the opening 312 of the clip 310. The extension portion 111 extends outwardly beyond the opening 311 of the clip 310, whereby the clip 310 is firmly sandwiched between the extension portion 111 and the fins 120 of the heat sink 10. The extension portion 111 has portions 112 thereof engaged in the cutouts 315 of the clip 310 (see FIG. 6). Therefore, the clip 310 is stably engaged with the extension portion 111 of the heat sink 10.

The fan 50 is mounted on the heat sink 10 by a bracket 60. The bracket 60 comprises an annular main body 610 surrounding a periphery of an upper portion of fins 120 of the heat sink 10. Two pairs of ribs 630, parallel an axis of the main body 610, extend toward each other from an inner face of the main body 610. The ribs 630 are engaged in spaces between adjacent branches 123 of corresponding fins 120 of the heat sink 10. Four supports 650 evenly extend from an upper portion of the periphery of the main body 610 and support the fan 50 thereon. A hook 670 extends upwardly from each support 650 and is engaged in a corresponding fixing aperture (not labeled) of the fan 50, whereby the fan 50 is secured on the heat sink 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink comprising a heat conducting core and a plurality of fins extending from the core, the core having an extension portion for contacting a heat generating device; and
   a locking device comprising a locking plate defining an opening accommodating the extension portion of the core of the heat sink therein and having a plurality of locking arms extending from the plate, a plurality of cutouts circumferentially surrounding and communicating with the opening being defined in the plate;
   wherein, the extension portion of the core of the heat sink is punched/pressed to press the plate of the locking device toward the heat sink and have portions thereof engaged in the cutouts of the plate of the locking device, whereby the locking device is stably fixed to the heat sink; and
   wherein each locking arm defines a fixing aperture adjacent to a distal end thereof, a locking sleeve extending away the heat sink from the arm under the fixing aperture.

2. The heat dissipation device of claim 1, wherein the core of the heat sink is substantially cylindrical, the fins radially extending from a periphery of the core.

3. The heat dissipation device of claim 2, wherein the fins of the heat sink each have a trunk extending from the core of the heat sink and two branches splitting from the trunk.

4. The heat dissipation device of claim 3, wherein the fins of the heat sink are curved in a radial direction of the core of the heat sink.

5. The heat dissipation device of claim 2, wherein the plate of the locking device has an engaging portion engaging with the heat sink and embossed toward the heat sink.

6. The heat dissipation device of claim 5, wherein the engaging portion of the plate of the locking device extends to the locking arms.

7. The heat dissipation device of claim 5, wherein a protrusion extends from the engaging portion of the plate of the locking device and is engaged in a space defined between two adjacent fins of the heat sink.

8. The heat dissipation device of claim 1, wherein a plurality of fasteners is engaged in corresponding fixing apertures of the arms of the locking device.

9. The heat dissipation device of claim 1 further comprising a fan located on the heat sink, wherein the fan is attached to the heat sink by a holder engaged with the beat sink.

10. The heat dissipation device of claim 9, wherein the holder comprises an annular main body surrounding a periphery of an end portion of heat sink, a plurality of ribs extending from an inner face of the main body and engaged in spaces of fins, and a plurality of supports extending from an outer face of the main body and securing the fan thereon.

11. The heat dissipation device of claim 10, wherein the supports of the holder each extend a hook engaged with the fan by extending through a hole defined in the fan and abutting the fan toward the holder.

12. A heat dissipation device comprising:
   a heat sink comprising a core and a plurality of fins radially extending from the core, the core has an extension portion extending away the fins for contacting a heat generating device;
   a locking plate defining an central opening accommodating the extension portion of the core of the heat sink therein, an engaging portion emerging to the heat sink, a protrusion extending from the engaging portion and being engaged in a space defined between two adjacent fins of the heat sink, the locking plate being pressed toward the heat sink by the extension portion of the core of the heat sink by punching/pressing the extension portion, a plurality of fixing arms extending outwardly from the locking plate;
   a plurality of fasteners engaging with the fixing arms for fastening the heat sink to the heat generating device; and
   a fan located on the heat sink by a holder, wherein the holder comprises an annular main body surrounding a periphery of an end portion of heat sink, a plurality of ribs extending from an inner face of the main body and engaged in spaces of the fins, and a plurality of supports extending from an outer face of the main body and securing the fan thereon.

13. The heat dissipation device of claim 12, wherein the locking plate defines a plurality of cutouts around the opening thereof and communicating with the opening, the extension portion of the core of the heat sink has portions thereof engaged in the cutouts.

14. The heat dissipation device of claim 12, wherein the fins of the heat sink each comprises a trunk extending from the core and two branches splitting from the trunk.

15. A heat dissipation device comprising:
- a heat sink having a bottom extension and a plurality of fins above the bottom extension, the bottom extension having a bottom face adapted for thermally connecting with a heat-generating electronic component;
- a locking plate defining an opening through which the extension extends, a plurality of cutouts communicating with the opening wherein a portion of the extension engages in the cutouts whereby the extension and the locking plate are securely connected together, the locking plate further having fixing arms mounted with fasteners adapted for fixing the locking plate and the heat sink to a printed circuit board.

16. The heat dissipation device of claim 15, wherein the locking plate has an upward protrusion engaging in the fins.

17. The heat dissipation device of claim 16, wherein the locking plate has an upwardly embossed engaging portion engaging with the extension of the heat sink, the engaging portion extending to the fixing arms.

18. The heat dissipation device of claim 17 further comprising a fan mounted on a top of the heat sink via a holder.

* * * * *